(12) United States Patent
Saito et al.

(10) Patent No.: US 9,305,819 B2
(45) Date of Patent: Apr. 5, 2016

(54) SUBSTRATE PROCESSING SYSTEM

(71) Applicant: Tokyo Electron Limited, Tokyo (JP)

(72) Inventors: Yukiyoshi Saito, Koshi (JP); Tomohiro Kaneko, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 19 days.

(21) Appl. No.: 14/540,124

(22) Filed: Nov. 13, 2014

(65) Prior Publication Data

US 2015/0132085 A1 May 14, 2015

(30) Foreign Application Priority Data

Nov. 14, 2013 (JP) .................................. 2013-236271

(51) Int. Cl.
*H01L 21/677* (2006.01)
*H01L 21/67* (2006.01)

(52) U.S. Cl.
CPC .... *H01L 21/67778* (2013.01); *H01L 21/67178* (2013.01); *H01L 21/67781* (2013.01)

(58) Field of Classification Search
CPC ................................................ H01L 21/67778
See application file for complete search history.

(56) References Cited

U.S. PATENT DOCUMENTS

| | | | | |
|---|---|---|---|---|
| 6,893,171 B2* | 5/2005 | Fukutomi | ......... | H01L 21/67173 355/27 |
| 7,878,213 B2* | 2/2011 | Mitsuyoshi | .......... | B65G 49/061 134/133 |
| 8,023,099 B2* | 9/2011 | Yamamoto | ............ | G03F 7/0035 355/27 |
| 8,025,023 B2* | 9/2011 | Hayashida | ............... | G02F 1/130 118/300 |
| 8,031,324 B2* | 10/2011 | Fukutomi | ......... | H01L 21/67051 355/27 |
| 8,383,990 B2* | 2/2013 | Morita | .............. | H01L 21/67248 118/729 |
| 8,545,118 B2* | 10/2013 | Ogura | ............... | H01L 21/67196 396/611 |
| 8,851,008 B2* | 10/2014 | Fukutomi | ........... | H01L 21/6715 118/300 |
| 9,184,071 B2* | 11/2015 | Ogura | ............... | H01L 21/67173 |
| 2008/0129968 A1* | 6/2008 | Hayashida | ............ | G03F 7/3021 355/27 |
| 2008/0199283 A1 | 8/2008 | Mitsuyoshi | | |
| 2011/0078898 A1* | 4/2011 | Ishida | ............... | H01L 21/67051 29/771 |
| 2011/0082579 A1* | 4/2011 | Yoshida | ............ | G02F 21/67276 700/101 |
| 2013/0032179 A1* | 2/2013 | Kaneko | ............... | H01L 21/6715 134/133 |
| 2014/0152966 A1* | 6/2014 | Hwang | ................... | G03F 7/162 355/27 |
| 2015/0132086 A1* | 5/2015 | Saito | ................. | H01L 21/67178 414/222.13 |

FOREIGN PATENT DOCUMENTS

JP 5000627 B2 8/2012

* cited by examiner

*Primary Examiner* — Gerald McClain
(74) *Attorney, Agent, or Firm* — Pearne & Gordon LLP

(57) ABSTRACT

A first transfer apparatus unloads and transfers substrates from a cassette. A first accommodating unit accommodates the substrates. First substrate processing units divided into at least two groups and arranged in a height direction performs a process to the substrates. Second accommodating units respectively corresponding to the groups are arranged to be parallel with the first accommodating unit in the height direction. Second transfer apparatuses respectively corresponding to the groups unload and transfer the substrates from the second accommodating units corresponding to the same groups into the first substrate processing units of the same groups. Second substrate processing units respectively corresponding to the groups are arranged to be parallel with the first and second accommodating units in the height direction. A delivery apparatus delivers the substrates between the first and second accommodating units and transfers the substrates between the first accommodating unit and the second substrate processing units.

4 Claims, 8 Drawing Sheets

SUBSTRATE PROCESSING SYSTEM

CROSS-REFERENCE TO RELATED APPLICATION

This application claims the benefit of Japanese Patent Application No. 2013-236271 filed on Nov. 14, 2013, the disclosures of which are incorporated herein by reference.

TECHNICAL FIELD

The embodiments described herein pertain generally to a substrate processing system.

BACKGROUND

Conventionally, there has been known a substrate processing system that performs a substrate process, such as a liquid process with a processing liquid or a gas process with a processing gas, to a substrate such as a semiconductor wafer, or the like.

By way of example, a substrate processing system described in Patent Document 1 includes multiple substrate processing units stacked in multiple stages, a substrate accommodating unit capable of accommodating multiple substrates loaded from the outside, two substrate transfer apparatuses stacked up and down to respectively correspond to an upper group and a lower group of the multiple substrate processing units and configured to unload substrates from the substrate accommodating unit and load the substrates into the substrate processing units, and a substrate delivery apparatus configured to deliver a substrate accommodated in the substrate accommodating unit to another position in the substrate accommodating unit.

In this substrate processing system, the substrates loaded from the outside are accommodated at an accommodation position in a lower portion within the substrate accommodating unit. Then, substrates, which are processed in the lower group of the substrate processing units, are unloaded by the substrate transfer apparatus corresponding to the lower group, and then, loaded into the lower group of the substrate processing units. Further, substrates, which are processed in the upper group of the substrate processing units, are delivered by the substrate delivery apparatus to an accommodation position in an upper portion within the substrate accommodating unit. Subsequently, the substrates are unloaded by the substrate transfer apparatus corresponding to the upper group, and then loaded into the upper group of the substrate processing units.

Further, the substrate processing system described in Patent Document 1 includes an inverting device configured to invert the front and rear surfaces of a substrate. A substrate accommodated in the substrate accommodating unit is unloaded by the substrate transfer apparatus and then loaded into the inverting device if necessary. Then, after the front and rear surfaces of the substrate are inverted in the inverting device, the substrate is loaded into the substrate processing unit.

Patent Document 1: Japanese Patent Publication No. 5000627

However, in the substrate processing system described in Patent Document 1, the substrate transfer apparatus transfers substrates to the substrate processing units and also transfers substrates from the substrate accommodating unit to the inverting device. As a result, a heavy load is applied to the substrate transfer apparatus. For this reason, it is difficult to increase the number of wafers to be transferred per unit time in the substrate processing system.

Further, such a problem may occur, not only in the inverting device, but in a case where the substrate transfer apparatus accesses another processing unit such as an inspection device.

SUMMARY

In view of the foregoing, example embodiments provide a substrate processing system capable of increasing the number of sheets to be transferred per unit time.

In one example embodiment, a substrate processing system includes a first transfer apparatus configured to unload substrates from a cassette that accommodates the substrates and configured to transfer the unloaded substrates; a first accommodating unit configured to accommodate the substrates transferred by the first transfer apparatus; multiple first substrate processing units, which are divided into at least two groups and arranged in a height direction, configured to perform a preset process to the respective substrates; multiple second accommodating units, which respectively correspond to the groups and are arranged to be parallel with the first accommodating unit in the height direction, configured to accommodate the substrates; multiple second transfer apparatuses, respectively corresponding to the groups, configured to unload the substrates from the second accommodating units corresponding to the same groups and transfer the substrates into the first substrate processing units belonging to the same groups; multiple second substrate processing units, which respectively correspond to the groups and are arranged to be parallel with the first accommodating unit and the second accommodating units in the height direction, configured to perform a certain process to the respective substrates; and a delivery apparatus configured to deliver the substrates between the first accommodating unit and the second accommodating units and configured to transfer the substrates between the first accommodating unit and the second substrate processing units.

In accordance with the example embodiment, it is possible to increase the number of wafers to be transferred per unit time by reducing a processing load on the second transfer apparatuses.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
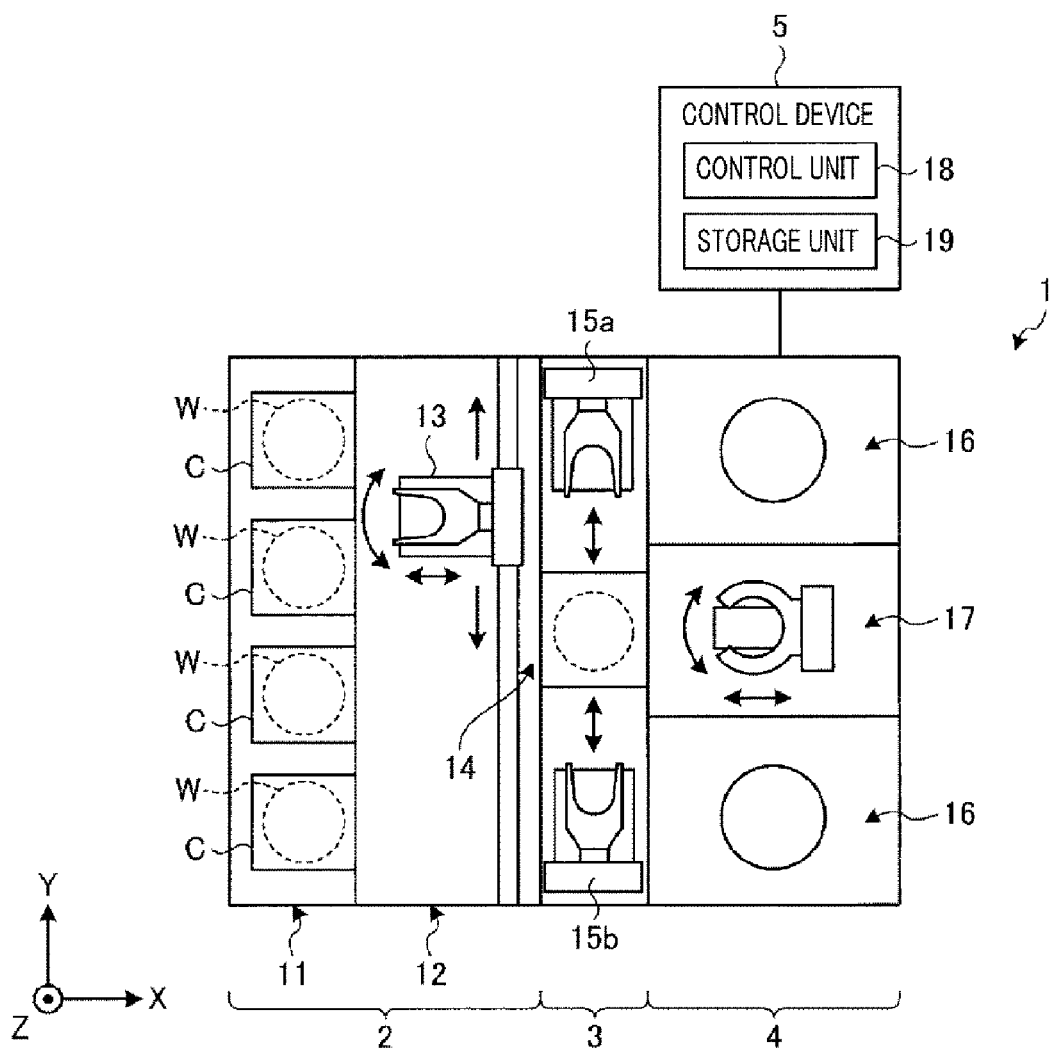
FIG. 1 is a diagram illustrating a configuration of a substrate processing system in accordance with a present example embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example embodiment. Still, the example embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, example embodiments of a substrate processing system will be explained in detail with reference to the accompanying drawings. Further, the present disclosure is not limited to the following example embodiments.

FIG. 1 is a diagram illustrating a configuration of a substrate processing system in accordance with a present example embodiment. Hereinafter, in order to clarify positional relationships, the X-axis, Y-axis and Z-axis directions are defined as being orthogonal to each other, and the positive direction of the Z-axis is regarded as a vertically upward direction.

As depicted in FIG. 1, a substrate processing system 1 includes a loading/unloading station 2, a delivery station 3, and a processing station 4.

The loading/unloading station 2 includes a carrier mounting unit 11 and a transfer unit 12. On the carrier mounting unit 11, multiple cassettes C each configured to accommodate multiple substrates, i.e., multiple semiconductor wafers (hereinafter, referred to as "wafers W") in the present example embodiment, in a horizontal posture.

The transfer unit 12 is arranged to be adjacent to the carrier mounting unit 11, and includes a first transfer apparatus 13 therein. The first transfer apparatus 13 is configured to transfer the wafers W between the cassette C and the delivery station 3.

The delivery station 3 is arranged to be adjacent to the loading/unloading station 2, and includes a delivery block 14 and multiple delivery apparatuses 15a and 15b therein.

In the delivery block 14, a first accommodating unit and a second accommodating unit each configured to accommodate the wafers W in multiple stages, and an inverting unit configured to invert the front and rear surfaces of the wafer W are stacked. The configuration of the delivery block 14 will be described in detail below.

The delivery apparatuses 15a and 15b are arranged to be adjacent to the delivery block 14. To be specific, the delivery apparatus 15a is arranged to be adjacent to the delivery block 14 in the positive direction of the Y-axis, and the delivery apparatus 15b is arranged to be adjacent to the delivery block 14 in the negative direction of the Y-axis. Each of the delivery apparatuses 15a and 15b delivers the wafer W among the first and second accommodating units and the inverting unit arranged in the delivery block 14.

The processing station 4 is arranged to be adjacent to the delivery station 3, and includes multiple cleaning units 16 and multiple second transfer apparatuses 17. The multiple cleaning units 16 are arranged to be adjacent to the second transfer apparatuses 17 in the positive direction and the negative direction of the Y-axis, respectively.

The multiple second transfer apparatuses 17 are stacked in two stages, i.e., upper and lower stages, and each of the second transfer apparatuses 17 is configured to transfer the wafer W between the delivery block 14 and the cleaning unit 16.

In the present example embodiment, the cleaning unit 16 includes a brush device therein and is configured to perform a cleaning process to the wafer W transferred through the second transfer apparatus 17 by contacting the wafer W with the brush device. Further, the cleaning unit 16 may perform a cleaning process with a chemical liquid such as SC1 (a mixed solution of ammonia and hydrogen peroxide water). The cleaning unit 16 is an example of "first substrate processing unit".

Further, the substrate processing system 1 includes a control device 5. The control device 5 is, for example, a computer, and includes a control unit 18 and a storage unit 19. In the storage unit 19, programs for controlling various processes to be performed in the substrate processing system 1 are stored. The control unit 18 reads and executes a program stored in the storage unit 19 to control an operation of the substrate processing system 1.

Further, the programs may be stored, for example, in a computer-readable storage medium and installed from the storage medium into the storage unit 19 of the control device 5. Examples of the computer-readable storage medium may include a hard disk (HD), flexible disk (FD), compact disk (CD), magneto-optical disk (MO), or memory card.

Figure 2:
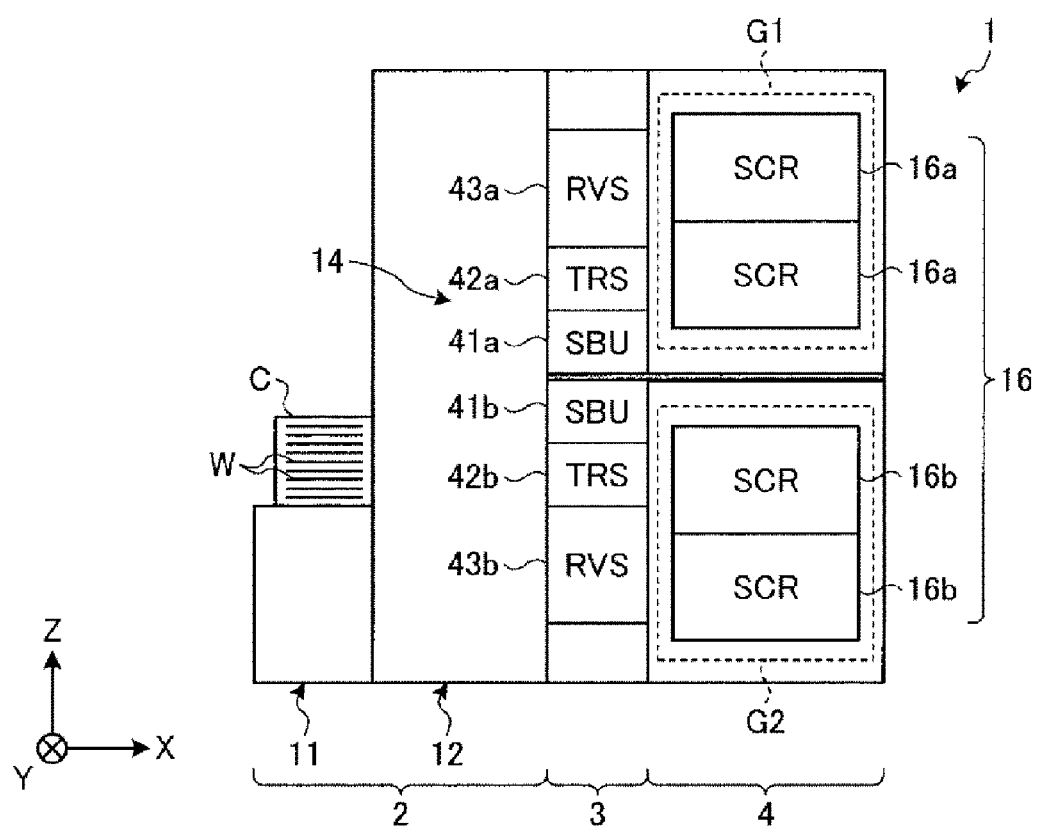
FIG. 2 is an arrangement diagram of a first accommodating unit, a second accommodating unit, an inverting unit, and a cleaning unit.

Hereinafter, the configuration of the delivery station 3 and the processing station 4 will be explained in detail. Arrangement of the first accommodating unit, the second accommodating unit, and the inverting unit provided in the delivery block 14 of the delivery station 3 and the cleaning unit 16 provided in the processing station 4 will be explained with reference to FIG. 2. FIG. 2 is an arrangement diagram of the first accommodating unit, the second accommodating unit, the inverting unit, and the cleaning unit.

Further, in FIG. 2, the cleaning units 16 are denoted by "SCR", the first accommodating units 41a and 41b are denoted by "SBU", the second accommodating units 42a and 42b are denoted by "TRS", and the inverting units 43a and 43b are denoted by "RVS". The inverting units 43a and 43b are examples of "second substrate processing units".

As illustrated in FIG. 2, the multiple cleaning units 16 are arranged to be parallel with each other in four stages in a height direction. These cleaning units 16 are divided into two groups arranged in the height direction (Z-axis direction). To be specific, upper two cleaning units 16a belong to an upper group G1 and lower two cleaning units 16b belong to a lower group G2.

Further, the cleaning units 16 depicted in FIG. 2 respectively correspond to the cleaning units 16 arranged in the negative direction of the Y-axis of the second transfer apparatus 17 depicted in FIG. 1. Although illustration is omitted herein, the cleaning units 16 arranged in the positive direction of the Y-axis of the second transfer apparatus 17 also have the same configuration of the cleaning units 16 depicted in FIG. 2. Therefore, in the processing station 4, in both the negative direction and the positive direction of the Y-axis of the second transfer apparatus 17, four cleaning units 16a and 16b (eight in total) are arranged.

In the delivery block 14, the two first accommodating units 41a and 41b, the two second accommodating units 42a and 42b, and the two inverting units 43a and 43b are stacked. Each of the first accommodating units 41a and 41b serves as a region where the wafers W loaded into the substrate processing system 1 by the first transfer apparatus 13 (see FIG. 1) or the wafers W unloaded from the substrate processing system 1 by the first transfer apparatus 13 are temporarily accommodated.

Figure 3A:
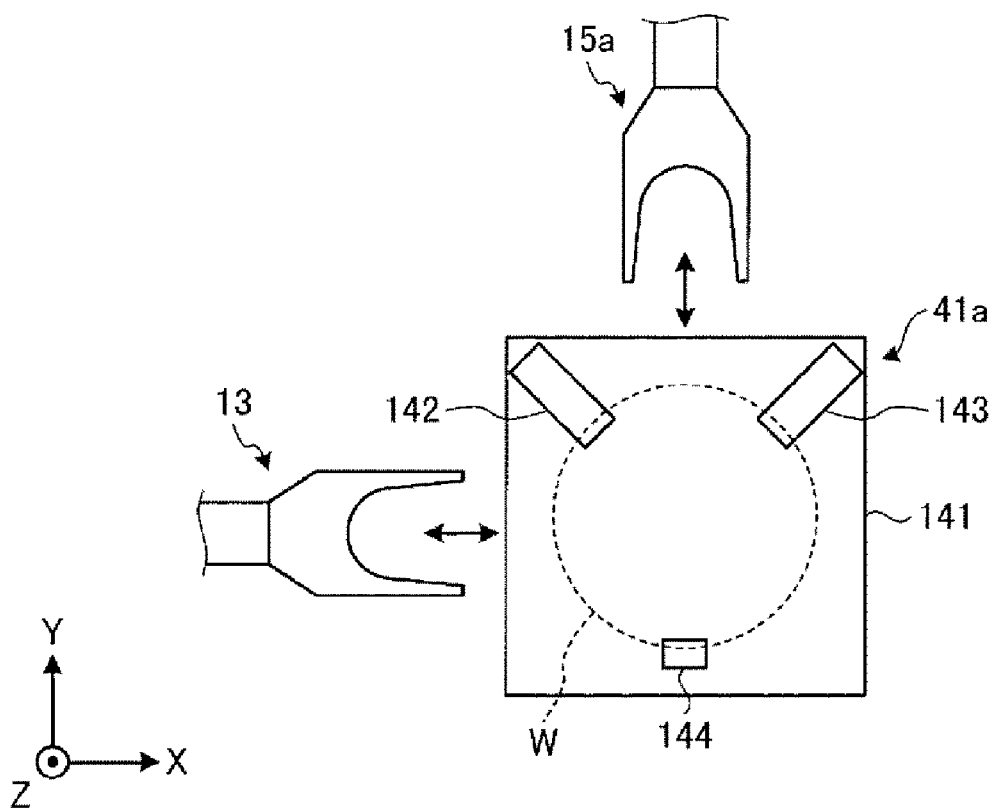
FIG. 3A is a diagram illustrating a configuration of the first accommodating unit.
Figure 3B:
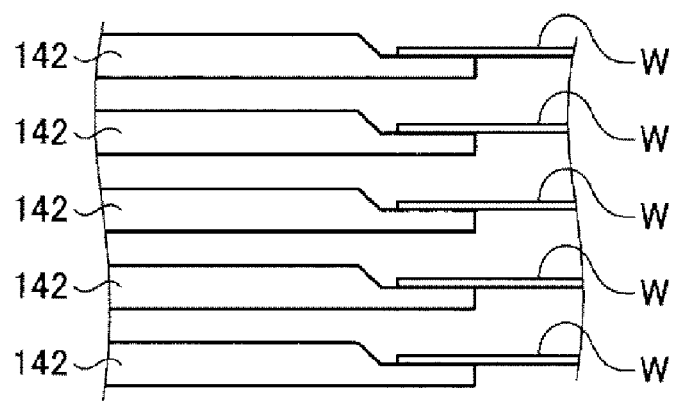
FIG. 3B is a diagram illustrating a configuration of the first accommodating unit.

Hereinafter, the configuration of the first accommodating units 41a and 41b will be explained with reference to FIG. 3A and FIG. 3B. FIG. 3A and FIG. 3B are diagrams illustrating a configuration of the first accommodating units 41a and 41b. Further, FIG. 3A illustrates a configuration of the first accommodating unit 41a as an example, and the first accommodating unit 41b has the same configuration as the first accommodating unit 41a.

As illustrated in FIG. 3A, the first accommodating unit 41a includes a base member 141 and three supporting members 142, 143, and 144 uprightly provided on the base member 141. The three supporting members 142, 143, and 144 are arranged along a circumferential direction at regular intervals of about 120 degrees, and leading ends of the supporting members 142, 143, and 144 support an outer peripheral portion of the wafer W. Further, each of the supporting members 142, 143, and 144 is provided in plural stages along the height direction (see, for example, the multiple supporting members 142 illustrated in FIG. 3B). Thus, the first accommodating unit 41a may accommodate multiple wafers W in multiple stages.

The first transfer apparatus 13 and the delivery apparatus 15a access the first accommodating unit 41a in respectively different directions. To be specific, the first transfer apparatus 13 enters the first accommodating unit 41a while passing through spaces between the supporting members 142 and the supporting members 144 from the negative direction of the X-axis of the first accommodating unit 41a. Further, the delivery apparatus 15a enters the first accommodating unit 41a while passing through spaces between the supporting members 142 and the supporting members 143 from the positive direction of the Y-axis of the first accommodating unit 41a.

As depicted in FIG. 2, as for the first accommodating units 41a and 41b, the second accommodating units 42a and 42b, and the inverting units 43a and 43b, the inverting unit 43b, the second accommodating unit 42b, the first accommodating unit 41b, the first accommodating unit 41a, the second accommodating unit 42a, and the inverting unit 43a are stacked in sequence from the bottom.

The first accommodating unit 41a, the second accommodating unit 42a, and the inverting unit 43a arranged at an upper portion of the delivery block 14 correspond to the upper group G1, and the first accommodating unit 41b, the second accommodating unit 42b, and the inverting unit 43b arranged at a lower portion of the delivery block 14 correspond to the lower group G2.

To be specific, wafers W processed or to be processed in the cleaning units 16a belonging to the upper group G1 are loaded into the first accommodating unit 41a, the second accommodating unit 42a, and the inverting unit 43a corresponding to the upper group G1. Further, wafers W processed or to be processed in the cleaning units 16b belonging to the lower group G2 are loaded into the first accommodating unit 41b, the second accommodating unit 42b, and the inverting unit 43b corresponding to the lower group G2.

Herein, one first accommodating unit, one second accommodating unit, and one inverting unit are provided in each of the groups G1 and G2. However, multiple first accommodating units, multiple second accommodating units, and multiple inverting units may be provided in each of the groups G1 and G2.

Figure 4:
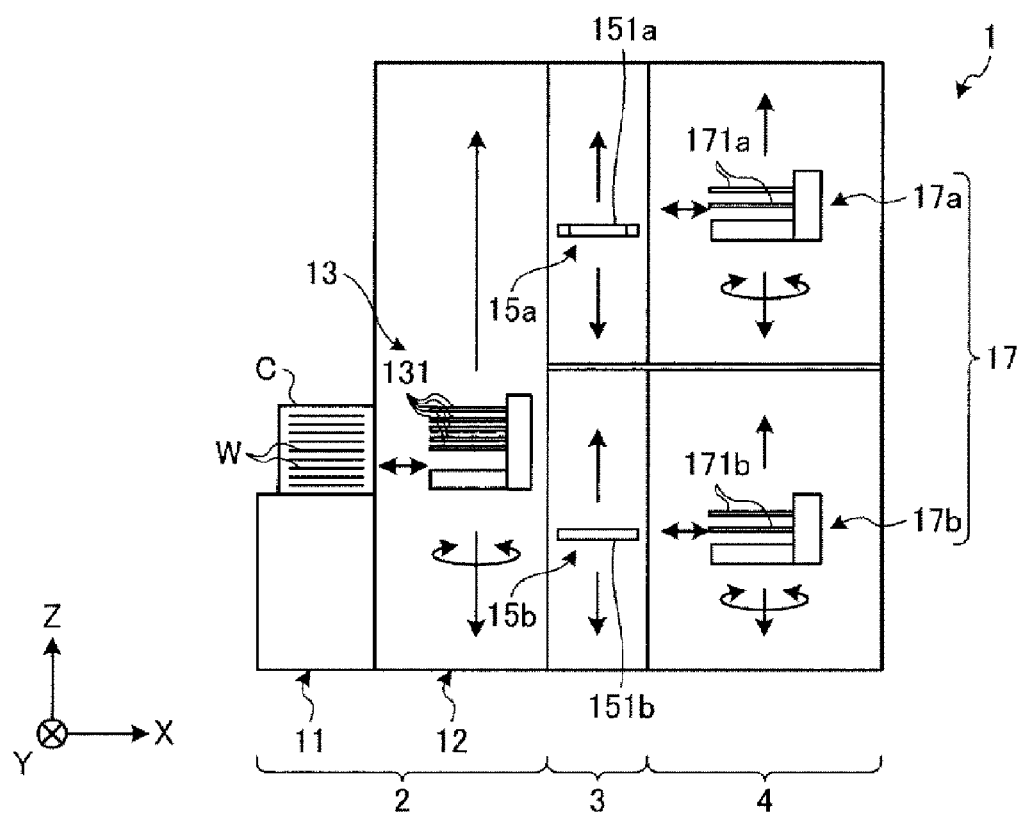
FIG. 4 is an arrangement diagram of a first transfer apparatus, a delivery apparatus, and a second transfer apparatus.

Hereinafter, arrangement of the first transfer apparatus 13, the delivery apparatuses 15a and 15b, and the second transfer apparatus 17 will be explained with reference to FIG. 4. FIG. 4 is an arrangement diagram of the first transfer apparatus 13, the delivery apparatuses 15a and 15b, and the second transfer apparatus 17.

The delivery apparatus 15a is arranged to be adjacent to the delivery block 14 in the positive direction of the Y-axis, and the delivery apparatus 15b is arranged to be adjacent to the delivery block 14 in the negative direction of the Y-axis (see FIG. 1). Further, the second transfer apparatus 17 is arranged between the cleaning unit 16 provided at the positive direction side of the Y-axis of the processing station 4 and the cleaning units 16 provided at the negative direction side of the Y-axis thereof (see FIG. 1). Meanwhile, the both delivery apparatuses 15a and 15b may be arranged at one side in the positive direction or negative direction of the Y-axis of the delivery block 14.

As depicted in FIG. 4, the first transfer apparatus 13 includes multiple (herein, five) wafer holding units 131 each configured to hold thereon the wafer W. Further, the first transfer apparatus 13 can be delivered in a horizontal direction and a vertical direction and can be rotated around a vertical axis, and can also transfer multiple wafers W at the same time between the cassette C and the first accommodating units 41a and 41b through the wafer holding units 131.

The delivery apparatuses 15a and 15b respectively transfer the wafers W between the first accommodating units 41a and 41b and the second accommodating units 42a and 42b or between the first accommodating units 41a and 41b and the inverting units 43a and 43b depicted in FIG. 2.

To be specific, the delivery apparatus 15a corresponds to the upper group G1 and transfers a wafer W with a wafer holding unit 151a between the first accommodating unit 41a and the second accommodating unit 42a or between the first accommodating unit 41a and the inverting unit 43a corresponding to the same upper group G1. Further, the delivery apparatus 15b corresponds to the lower group G2 and transfers a wafer W with a wafer holding unit 151b between the first accommodating unit 41b and the second accommodating unit 42b or between the first accommodating unit 41b and the inverting unit 43b corresponding to the same lower group G2.

The delivery apparatus 15a is arranged above the delivery apparatus 15b. To be specific, the delivery apparatus 15a corresponding to the upper group G1 is arranged at substantially the same height position as the first accommodating unit 41a, the second accommodating unit 42a, and the inverting unit 43a corresponding to the same upper group G1. Further, the delivery apparatus 15b corresponding to the lower group G2 is arranged at substantially the same height position as the first accommodating unit 41b, the second accommodating unit 42b, and the inverting unit 43b corresponding to the same lower group G2.

The second transfer apparatuses 17a and 17b are stacked in two stages, i.e., upper and lower stages. The second transfer apparatus 17a includes multiple (herein, two) wafer holding units 171a each configured to hold thereon a wafer W. Likewise, the second transfer apparatus 17b includes multiple (herein, two) wafer holding units 171b each configured to hold thereon a wafer W. Further, the second transfer apparatuses 17a and 17b can be delivered in the horizontal direction and the vertical direction, and respectively transfer wafers W with the wafer holding units 171a and 171b between the second accommodating units 42a and 42b and the cleaning units 16a and 16b or between the inverting units 43a and 43b and the cleaning units 16a and 16b. The second transfer apparatuses 17a and 17b respectively use the lower wafer holding units 171a and 171b in order to load wafers W into each unit, and respectively use the upper wafer holding units 171a and 171b in order to unload wafers W from each unit.

In the second transfer apparatuses 17a and 17b, the second transfer apparatus 17a arranged in an upper portion of the processing station 4 corresponds to the upper group G1, and transfers a wafer W between the second accommodating unit 42a and the cleaning unit 16a or between the inverting unit 43a and the cleaning unit 16a corresponding to the same upper group G1. Further, in the second transfer apparatuses 17a and 17b, the second transfer apparatus 17b arranged in a lower portion of the processing station 4 corresponds to the lower group G2, and transfers a wafer W between the second accommodating unit 42b and the cleaning unit 16b or between the inverting unit 43b and the cleaning unit 16b corresponding to the same lower group G2.

Hereinafter, there will be explained a process sequence of a substrate transfer process performed by the substrate processing system 1 in accordance with the present example embodiment. There will be first explained a process sequence of a substrate transfer process in a case where a process is performed by the cleaning units 16a and 16b without performing a process by the inverting units 43a and 43b with reference to FIG. 5.

Figure 5:
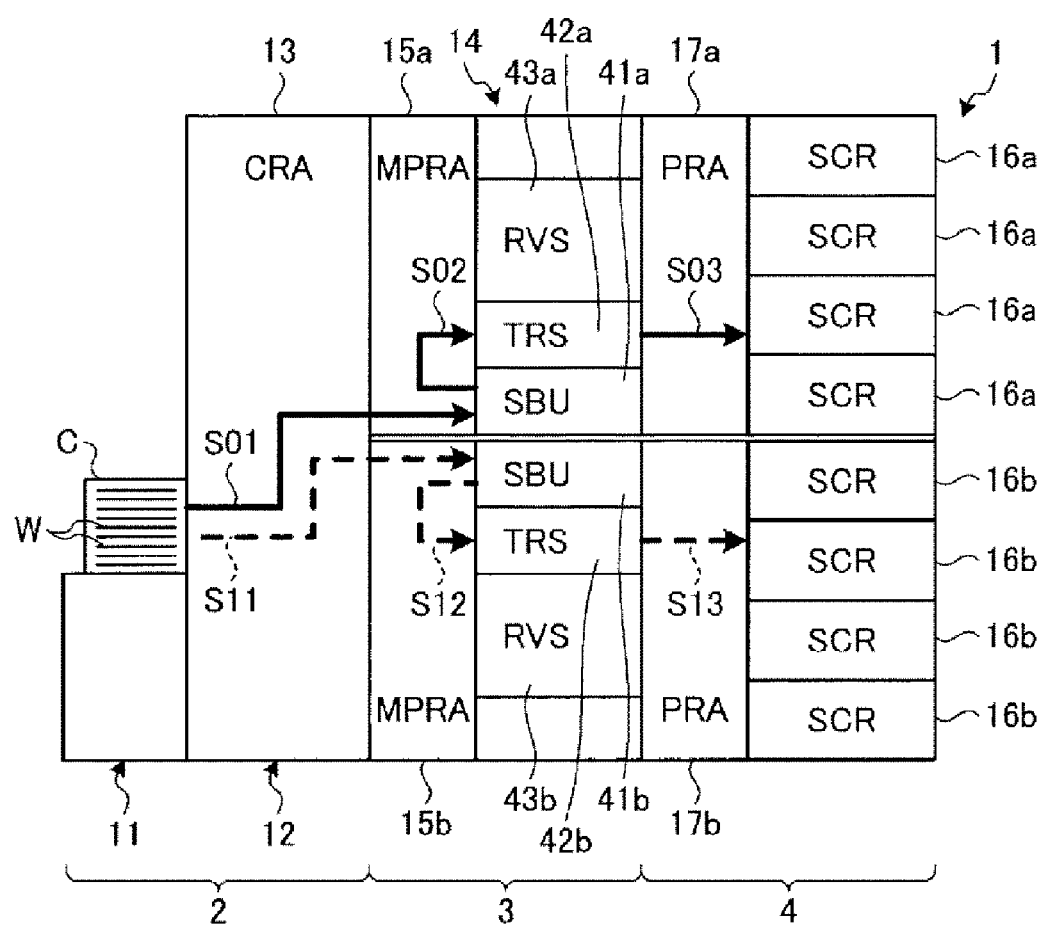
FIG. 5 is an explanatory diagram of showing a substrate transfer process in a case where a process is performed by the cleaning unit without performing a process by the inverting unit.

FIG. 5 is an explanatory diagram of showing a substrate transfer process in a case where a process is performed by the cleaning units 16a and 16b without performing a process by the inverting units 43a and 43b. Further, the substrate transfer process illustrated in FIG. 5 is performed, for example, when only a front surface of a wafer W is cleaned.

Herein, in FIG. 5, the first transfer apparatus 13 is denoted by "CRA", the delivery apparatuses 15a and 15b are denoted by "MPRA", and the second transfer apparatuses 17a and 17b are denoted by "PRA". Further, in FIG. 5, for easier understanding, the delivery apparatuses 15a and 15b provided between the first transfer apparatus 13 and the delivery block 14, and the second transfer apparatuses 17a and 17b provided between the delivery block 14 and the cleaning units 16a and 16b are conveniently illustrated.

As depicted in FIG. 5, in the substrate processing system 1, the first transfer apparatus 13 collectively unloads five unprocessed wafers W from the cassette C to accommodate the wafers W in the first accommodating unit 41a corresponding to the upper group G1 (S01). Further, the first transfer apparatus 13 collectively unloads five unprocessed wafers W again from the cassette C to accommodate the wafers W in the first accommodating unit 41b corresponding to the lower group G2 (S11). As such, the first transfer apparatus 13 alternately performs the process of accommodating unprocessed wafers W unloaded from the cassette C in the first accommodating unit 41a and the process of accommodating unprocessed wafers W unloaded from the cassette C in the first accommodating unit 41b.

Then, the delivery apparatus 15a corresponding to the upper group G1 unloads the unprocessed wafers W one by one from the first accommodating unit 41a corresponding to the upper group G1 and delivers the unloaded wafers W to the second accommodating unit 42a corresponding to the upper group G1 (S02). Further, the delivery apparatus 15b corresponding to the lower group G2 unloads the unprocessed wafers W one by one from the first accommodating unit 41b corresponding to the lower group G2 and delivers the unloaded wafers W to the second accommodating unit 42b corresponding to the lower group G2 (S12).

As depicted in FIG. 5, the first accommodating units 41a and 41b are arranged at a middle height position between the upper group G1 and the lower group G2 arranged adjacent to each other. The system in the present example embodiment includes only these two groups. Thus, the middle height position is equivalent to an middle height position in the delivery block 14. To be specific, the first accommodating units 41a and 41b are stacked in upper and lower two stages between the second accommodating unit 42a and the inverting unit 43a corresponding to the upper group G1 and the second accommodating unit 42b and the inverting unit 43b corresponding to the lower group G2. In the present example embodiment, the bottom surface of the first accommodating unit 41a has the same height position as the bottom surface of the upper group G1, and the top surface of the second accommodating unit 41b has the same height position as the top surface of the second group G2.

Further, the second accommodating unit 42a corresponding to the upper group G1 is arranged on the first accommodating unit 41a corresponding to the upper group G1, and the second accommodating unit 42b corresponding to the lower group G2 is arranged below the first accommodating unit 41b corresponding to the lower group G2.

The first accommodating units 41a and 41b are arranged at the middle height position in the delivery block 14 and the second accommodating units 42a and 42b are arranged on and below the first accommodating units 41a and 41b, respectively. As a result, it is possible to shorten moving distances of the delivery apparatuses 15a and 15b when the wafers W are delivered from the first accommodating units 41a and 41b to the second accommodating units 42a and 42b, respectively. Further, with the configuration as described above, a moving distance of the delivery apparatus 15a corresponding to the upper group G1 can be equivalent to a moving distance of the delivery apparatus 15b corresponding to the lower group G2, and, thus, it is possible to suppress a difference in processing times between the groups G1 and G2.

Then, the unprocessed wafers W accommodated in the second accommodating unit 42a are unloaded one by one by the second transfer apparatus 17a corresponding to the upper group G1 from the second accommodating unit 42a and transferred into the cleaning unit 16a of the upper group G1 (S03). Likewise, the unprocessed wafers W accommodated in the second accommodating unit 42b are unloaded one by one by the second transfer apparatus 17b corresponding to the lower group G2 from the second accommodating unit 42b and transferred into the cleaning unit 16b of the lower group G2 (S13). Then, the wafers W transferred into the cleaning units 16a and 16b are cleaned by the cleaning units 16a and 16b, respectively.

Then, the wafers W processed by the cleaning units 16a and 16b are accommodated in the cassette C in a reverse sequence in which they are loaded. By way of example, the wafers W cleaned by the cleaning unit 16a of the upper group G1 are unloaded one by one by the second transfer apparatus 17a corresponding to the upper group G1 from the cleaning unit 16a and transferred to the second accommodating unit 42a corresponding to the upper group G1. Then, the delivery apparatus 15a corresponding to the upper group G1 unloads the wafers W one by one from the second accommodating unit 42a and delivers the unloaded wafers W to the first accommodating unit 41a, and the first transfer apparatus 13 collectively unloads the five wafers W from the first accommodating unit 41a to load the wafers W back to the cassette C. The same operations may be applied to the lower group G2. Among the above-described operations, the operations of transferring and delivering substrates from when the substrates are placed in the first accommodating unit 41a corresponding to the upper group G1 to when the substrates are placed in the first accommodating unit 41a again and the operations of transferring and delivering substrates from when the substrates are placed in the first accommodating unit 41b corresponding to the lower group G2 to when the substrates are placed in the first accommodating unit 41b again are carried out at the same time in parallel.

Hereinafter, there will be explained a process sequence of a substrate transfer process in a case where a process is performed by the cleaning units 16a and 16b after a process is performed by the inverting units 43a and 43b with reference to FIG. 6.

Figure 6:
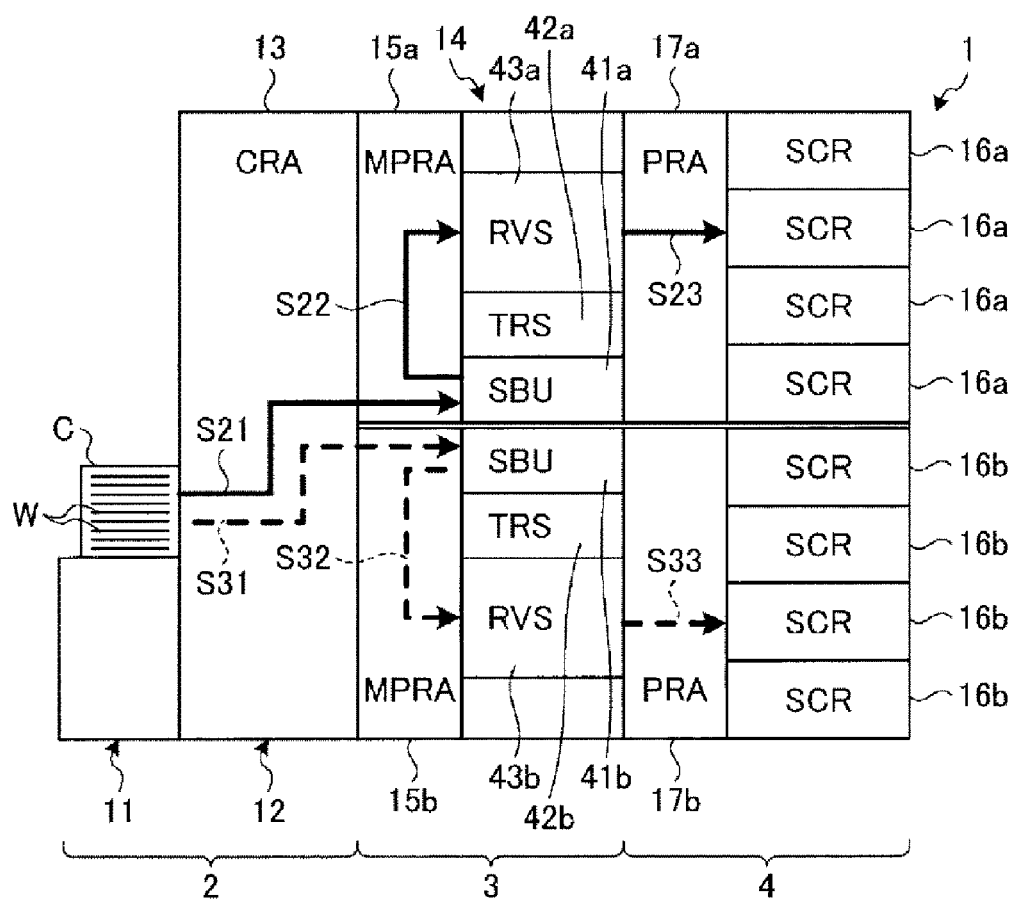
FIG. 6 is an explanatory diagram of showing a substrate transfer process in a case where a process is performed by the cleaning unit after a process is performed by the inverting unit.

FIG. 6 is an explanatory diagram of showing a substrate transfer process in a case where a process is performed by the cleaning units 16a and 16b after a process is performed by the inverting units 43a and 43b. Further, the substrate transfer process illustrated in FIG. 6 is performed, for example, when a rear surface of a wafer W is cleaned.

As depicted in FIG. 6, the first transfer apparatus 13 collectively unloads five unprocessed wafers W from the cassette C to accommodate the wafers W in the first accommodating unit 41a corresponding to the upper group G1 (S21). Further, the first transfer apparatus 13 collectively unloads five unprocessed wafers W again from the cassette C to accommodate the wafers W in the first accommodating unit 41b corresponding to the lower group G2 (S31).

Then, the delivery apparatus 15a corresponding to the upper group G1 unloads the unprocessed wafers W one by one from the first accommodating unit 41a corresponding to the upper group G1 and transfers the unloaded wafers W to the inverting unit 43a corresponding to the upper group G1 (S22). Further, the delivery apparatus 15b corresponding to the lower group G2 unloads the unprocessed wafers W one by one from the first accommodating unit 41b corresponding to the lower group G2 and transfers the unloaded wafers W to the inverting unit 43b corresponding to the lower group G2 (S32). The front and rear surfaces of the wafer W transferred to the inverting units 43a and 43b are inverted by the inverting units 43a and 43b.

Further, the second transfer apparatus 17a corresponding to the upper group G1 unloads the inverted wafers W one by one from the inverting unit 43a corresponding to the upper group G1 and transfers the unloaded wafers W to the cleaning unit 16a corresponding to the upper group G1 (S23). Further, the second transfer apparatus 17b corresponding to the lower group G2 unloads the inverted wafers W one by one from the inverting unit 43b corresponding to the lower group G2 and transfers the unloaded wafers W to the cleaning unit 16b corresponding to the lower group G2 (S33).

The cleaned wafers W are unloaded one by one from the cleaning units 16a and 16b by the second transfer apparatuses 17a and 17b and transferred to the second accommodating units 42a and 42b, respectively. Then, the wafers W are transferred one by one from the second accommodating units 42a and 42b to the first accommodating units 41a and 41b by the delivery apparatuses 15a and 15b, and then, the first transfer apparatus 13 collectively unloads five wafers W from the first accommodating units 41a and 41b to transfer the wafers W to the cassette C. Among the above-described operations, the operations of transferring and delivering substrates from when the substrates are placed in the first accommodating unit 41a corresponding to the upper group G1 to when the substrates are placed in the first accommodating unit 41a again and the operations of transferring and delivering substrates from when the substrates are placed in the first accommodating unit 41b corresponding to the lower group G2 to when the substrates are placed in the first accommodating unit 41b again are carried out at the same time in parallel.

As such, in the substrate processing system 1 in accordance with the present example embodiment, wafers W are transferred from the first accommodating units 41a and 41b to the inverting units 43a and 43b by the delivery apparatuses 15a and 15b instead of the second transfer apparatuses 17a and 17b, respectively. Thus, a processing load on the second transfer apparatuses 17a and 17b can be reduced. Therefore, even if an inverting process is performed, it is possible to increase the number of wafers to be transferred per unit time.

Further, in the substrate processing system 1 in accordance with the present example embodiment, the inverting unit 43a corresponding to the upper group G1 is arranged on the second accommodating unit 42a corresponding to the upper group G1, and the inverting unit 43b corresponding to the lower group G2 is arranged below the second accommodating unit 42b corresponding to the lower group G2.

As such, the inverting units 43a and 43b are arranged farther from the first accommodating units 41a and 41b than the second accommodating units 42a and 42b corresponding to the same groups G1 and G2, respectively. For this reason, as compared with a case where the inverting units 43a and 43b are respectively arranged between the first accommodating units 41a and 41b and the second accommodating units 42a and 42b, it is possible to shorten moving distances of the delivery apparatuses 15a and 15b when the wafers W are delivered from the first accommodating units 41a and 41b to the second accommodating units 42a and 42b, respectively.

Herein, it is possible to consider that by arranging the inverting units 43a and 43b between the first accommodating units 41a and 41b and the second accommodating units 42a and 42b, moving distances of the delivery apparatuses 15a and 15b can be shortened when the wafers W are delivered from the first accommodating units 41a and 41b to the inverting units 43a and 43b.

However, the second accommodating units 42a and 42b are used in any one of a case where only a front surface of a wafer W is cleaned, a case where only a rear surface of the wafer W is cleaned, and a case where both surfaces of the wafer W are cleaned, which will be described below, whereas the inverting units 43a and 43b may not be used in some cases, for example, as depicted in FIG. 4.

Therefore, by setting distances between the second accommodating units 42a and 42b and the first accommodating units 41a and 41b to be shorter than those between the inverting units 43a and 43b and the first accommodating units 41a and 41b, moving distances of the delivery apparatuses 15a and 15b can be shortened when the wafers W are delivered from the first accommodating units 41a and 41b to the second accommodating units 42a and 42b, which is effective in increasing the number of wafers to be transferred per unit time in the substrate transfer process.

Further, as depicted in FIG. 5 and the like, the inverting units 43*a* and 43*b* has greater heights than the second accommodating units 42*a* and 42*b*, respectively. For this reason, if the inverting units 43*a* and 43*b* are interposed between the first accommodating units 41*a* and 41*b* and the second accommodating units 42*a* and 42*b*, the moving distances of the delivery apparatuses 15*a* and 15*b* are greatly increased when the wafers W are delivered from the first accommodating units 41*a* and 41*b* to the second accommodating units 42*a* and 42*b*. For this reason, it is desirable to set distances between the second accommodating units 42*a* and 42*b* and the first accommodating units 41*a* and 41*b* to be shorter than those between the inverting units 43*a* and 43*b* and the first accommodating units 41*a* and 41*b*. With such arrangement, it is possible to increase the number of wafers to be transferred per unit time.

Hereinafter, there will be explained a process sequence of a substrate transfer process in a case where a process is performed by the inverting units 43*a* and 43*b* before and after a process is performed by the cleaning units 16*a* and 16*b* with reference to FIG. 7.

Figure 7:
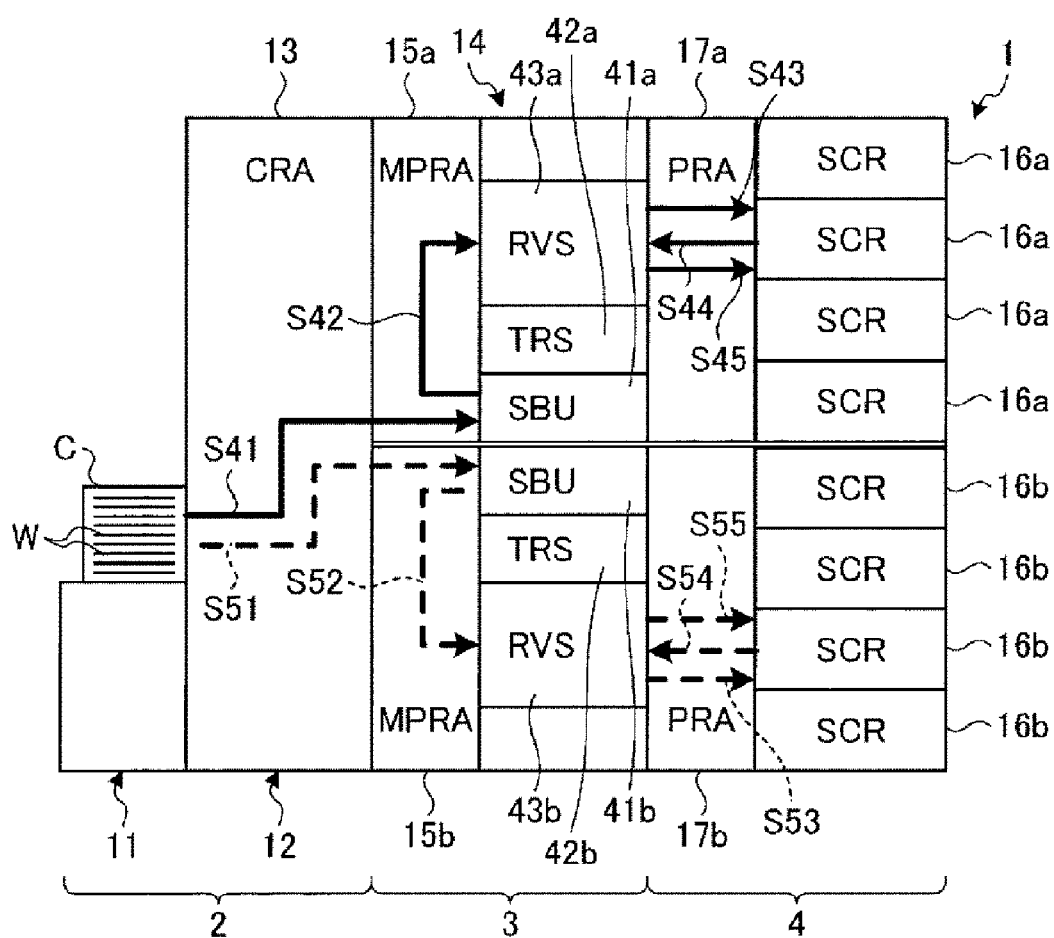
FIG. 7 is an explanatory diagram of showing a substrate transfer process in a case where a process is performed by the inverting unit before and after a process is performed by the cleaning unit.

FIG. 7 is an explanatory diagram of showing a substrate transfer process in a case where a process is performed by the inverting units 43*a* and 43*b* before and after a process is performed by the cleaning units 16*a* and 16*b*. Further, the substrate transfer process illustrated in FIG. 7 is performed, for example, when both surfaces of a wafer W are cleaned. In the present example embodiment, two of the four the cleaning units 16*a* are assigned for cleaning the front surface, and the other two cleaning units 16*a* are assigned for cleaning the rear surface. The cleaning units 16*b* are assigned in the same manner.

Processes S41 to S43 and processes S51 to S53 as depicted in FIG. 7 show a process sequence from when front and rear surfaces of unprocessed wafers W are inverted to when the wafers W are transferred to cleaning units 16*a* and 16*b*, and these are the same as processes S21 to S23 and processes S31 to S33, respectively, as depicted in FIG. 6.

The wafers W of which rear surfaces are cleaned by the cleaning unit 16*a* belonging to the upper group G1 are unloaded one by one from the cleaning unit 16*a* by the second transfer apparatus 17*a* corresponding to the upper group G1 to be transferred again to the inverting unit 43*a* corresponding to the upper group G1 (S44). Front and rear surfaces of the wafers W transferred to the inverting unit 43*a* are inverted by the inverting unit 43*a*, and then, the wafers W are unloaded one by one by the second transfer apparatus 17*a* to be transferred again to the cleaning unit 16*a* (S45). The front surfaces of the wafers W are cleaned by the cleaning unit 16*a*.

Likewise, the wafers W of which rear surfaces are cleaned by the cleaning unit 16*b* belonging to the lower group G2 are unloaded one by one from the cleaning unit 16*b* by the second transfer apparatus 17*b* to be transferred again to the inverting unit 43*b* (S54). Then, front and rear surfaces of the wafers W are inverted by the inverting unit 43*b*, and then, the wafers W are transferred one by one again to the cleaning unit 16*b* by the second transfer apparatus 17*b* (S55). The front surfaces of the wafers W are cleaned by the cleaning unit 16*b*.

As such, wafers W are transferred between the cleaning units 16*a* and 16*b* and the inverting units 43*a* and 43*b* by the second transfer apparatuses 17*a* and 17*b*, respectively. Among the above-described operations, the operations of transferring and delivering substrates from when the substrates are placed in the first accommodating unit 41*a* corresponding to the upper group G1 to when the substrates are placed in the first accommodating unit 41*a* again and the operations of transferring and delivering substrates from when the substrates are placed in the first accommodating unit 41*b* corresponding to the lower group G2 to when the substrates are placed in the first accommodating unit 41*b* again are carried out at the same time in parallel.

Figure 8:
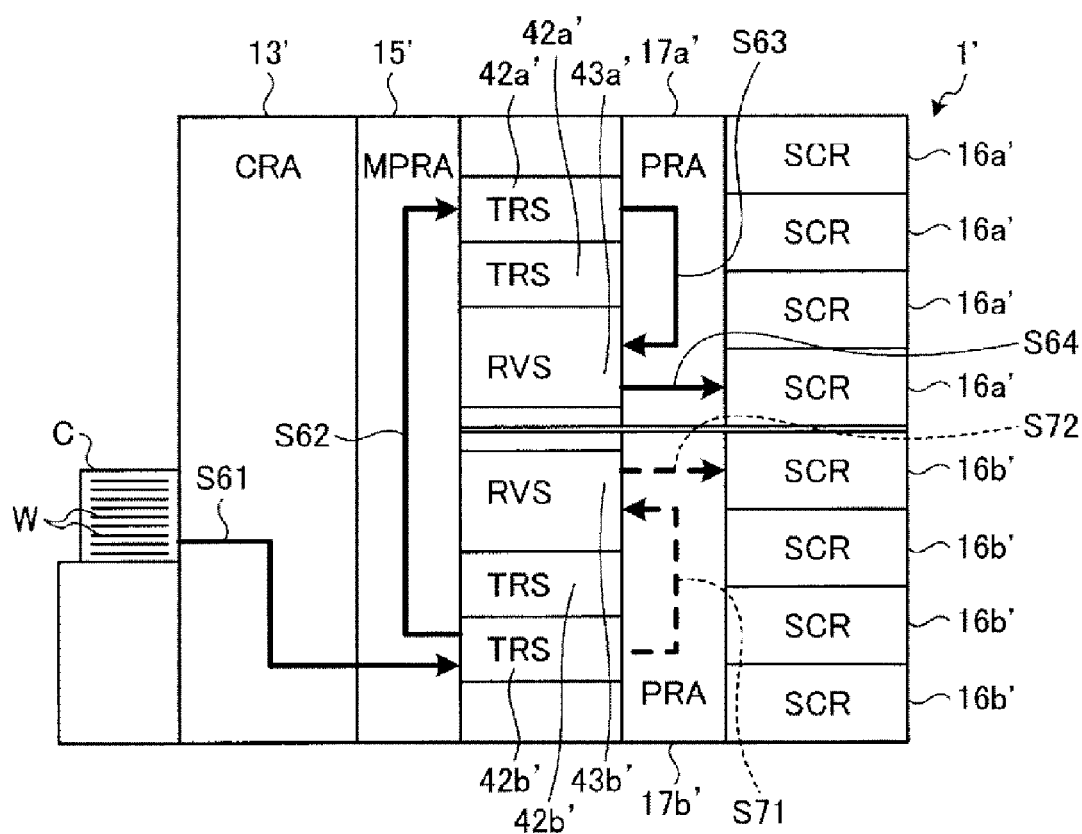
FIG. 8 is an explanatory diagram of showing a substrate transfer process in a conventional substrate processing system.

Hereinafter, there will be explained a comparison between the substrate transfer processes performed in the conventional substrate processing system and in the substrate processing system 1 in accordance with the present example embodiment. FIG. 8 is an explanatory diagram of showing a substrate transfer process in the conventional substrate processing system. Further, FIG. 8 shows a process sequence of a substrate transfer process in a case where a process is performed by cleaning units 16*a*' and 16*b*' after a process is performed by inverting units 43*a*' and 43*b*'.

As depicted in FIG. 8, in the conventional substrate processing system 1', as for second accommodating units 42*a*' and 42*b*' and inverting units 43*a*' and 43*b*', the second accommodating unit 42*b*', the second accommodating unit 42*b*', the inverting unit 43*b*', the inverting unit 43*a*', the second accommodating unit 42*a*', and the second accommodating unit 42*a*' are stacked in sequence from the bottom. Further, the conventional substrate processing system 1' includes a single delivery apparatus 15'.

In the conventional substrate processing system 1', a first transfer apparatus 13' unloads unprocessed wafers W from the cassette C to accommodate the wafers W in the second accommodating unit 42*b*' corresponding to the lower group (S61). The first transfer apparatus 13' repeats the above-described unloading process regardless of whether the wafers W are supposed to be processed by the cleaning unit 16*a*' corresponding to the upper group or by the cleaning unit 16*b*' corresponding to the lower group.

Then, a delivery apparatus 15' unloads the wafers W to be processed by the cleaning unit 16*a*' corresponding to the upper group from the second accommodating unit 42*b*' corresponding to the lower group to deliver the unloaded wafers W to the second accommodating unit 42*a*' corresponding to the upper group (S62).

As such, in the conventional substrate processing system 1', the single delivery apparatus 15' accesses both of the second accommodating unit 42*b*' corresponding to the lower group and the second accommodating unit 42*a*' corresponding to the upper group. Therefore, a moving distance of the delivery apparatus 15' is increased. This is one of factors that hinder an increase in the number of wafers to be transferred per unit time.

In contrast, the substrate processing system 1 in accordance with the present example embodiment includes the delivery apparatus 15*a* corresponding to the upper group G1 and the delivery apparatus 15*b* corresponding to the lower group G2, respectively. Further, the first accommodating units 41*a* and 41*b* are arranged at the middle height position in the delivery block 14. Further, the second accommodating unit 42*a* is arranged on the first accommodating unit 41*a* and the second accommodating unit 42*b* is arranged below the first accommodating unit 41*b*. Thus, in the substrate processing system 1 in accordance with the present example embodiment, moving distances of the delivery apparatuses 15*a* and 15*b* can be decreased. Therefore, it is possible to increase the number of wafers to be transferred per unit time.

Then, the second transfer apparatus 17*a*' corresponding to the upper group unloads the wafers W from the second accommodating unit 42*a*' corresponding to the upper group and transfers the unloaded wafers W to the inverting unit 43*a*' corresponding to the upper group (S63). Then, the second transfer apparatus 17a' unloads the wafers W, of which front and rear surfaces of the wafers W are inverted by the inverting unit 43a', from the inverting unit 43a' and transfers the wafers W to the cleaning unit 16a' belonging to the upper group (S64).

Likewise, the second transfer apparatus 17b' corresponding to the lower group unloads the wafers W from the second accommodating unit 42b' corresponding to the lower group and transfers the unloaded wafers W to the inverting unit 43b' corresponding to the lower group (S71). Then, the second transfer apparatus 17b' unloads the wafers W, of which front and rear surfaces of the wafers W are inverted by the inverting unit 43b', from the inverting unit 43b' and transfers the wafers W to the cleaning unit 16b' belonging to the lower group (S72).

As such, in the conventional substrate processing system 1', the wafers W are transferred from the second accommodating units 42a' and 42b' to the inverting units 43a' and 43b' by the second transfer apparatuses 17a' and 17b', respectively. Thus, a heavy processing load is applied on the second transfer apparatuses 17a' and 17b'.

In contrast, in the substrate processing system 1 in accordance with the present example embodiment, the delivery apparatuses 15a and 15b deliver the wafers W accommodated in the first accommodating units 41a and 41b to the inverting units 43a and 43b, respectively. Thus, in the substrate processing system 1 in accordance with the present example embodiment, it is possible to reduce a processing load on the second transfer apparatuses 17a and 17b. Therefore, it is possible to increase the number of wafers to be transferred per unit time.

As described above, the substrate processing system 1 in accordance with the present example embodiment includes the first transfer apparatus 13, the first accommodating units 41a and 41b, the multiple cleaning units 16a and 16b (corresponding to examples of "first substrate processing units"), the multiple second accommodating units 42a and 42b, the multiple second transfer apparatuses 17a and 17b, the multiple inverting units 43a and 43b (corresponding to examples of "second substrate processing units"), and the delivery apparatuses 15a and 15b.

The first transfer apparatus 13 unloads wafers W from the cassette C, which accommodates multiple wafers W therein, and transfers the wafers W. The first accommodating units 41a and 41b accommodate the wafers W transferred by the first transfer apparatus 13. The multiple cleaning units 16a and 16b are stacked in multiple stages, and divided into at least two groups arranged in a height direction. Further, each of the cleaning units 16a and 16b is configured to perform a cleaning process to the wafers W. The multiple second accommodating units 42a and 42b respectively corresponding to the groups are arranged to be parallel with the first accommodating units 41a and 41b at the overlapped positions in the height direction, and configured to accommodate the wafers W. The multiple second transfer apparatuses 17a and 17b respectively corresponding to the groups unload the wafers W from the second accommodating units 42a and 42b corresponding to the same groups and transfers the wafers W into the cleaning units 16a and 16b belonging to the same groups, respectively. The multiple inverting units 43a and 43b respectively corresponding to the groups are arranged to be parallel with the first accommodating units 41a and 41b and the second accommodating units 42a and 42b at the overlapped positions in the height direction, and configured to invert the front and rear surfaces of the wafers W. The delivery apparatuses 15a and 15b deliver the wafers W accommodated in the first accommodating units 41a and 41b to the second accommodating units 42a and 42b or deliver the wafers W to the inverting units 43a and 43b, respectively.

Thus, a processing load on the second transfer apparatuses 17a and 17b can be reduced. Therefore, it is possible to increase the number of wafers to be transferred per unit time.

Further, in the substrate processing system 1 in accordance with the present example embodiment, the first accommodating units 41a and 41b are arranged at the middle height position in the delivery block 14 (corresponding to an example of "processing block") including the first accommodating units 41a and 41b and the second accommodating units 42a and 42b, and the second accommodating units 42a and 42b respectively corresponding to the different groups are arranged on and below the first accommodating units 41a and 41b, respectively.

Thus, the moving distances of the delivery apparatuses 15a and 15b can be shortened. Therefore, it is possible to increase the number of wafers to be transferred per unit time.

In the above-described example embodiment, there has been explained the case where the multiple cleaning units 16 are divided into two groups, i.e., the upper group G1 and the lower group G2. The cleaning units 16 may be divided into three or more groups. In this case, if the arrangement or the delivering and transferring operations explained in the above example embodiment are applied to at least two adjacent groups, it is possible to increase the number of wafers to be transferred per unit time.

Further, in the above-described example embodiment, there has been explained the case where the inverting units 43a and 43b configured to invert front and rear surfaces of a wafer W are used as second substrate processing units. The second substrate processing units may be other substrate processing units than the inverting units. By way of example, the second substrate processing units may be inspection units configured to inspect a status of a front surface of a wafer W or may be UV irradiation units configured to irradiate ultraviolet to a wafer W.

Furthermore, in the above-described example embodiment, there has been explained a case where the substrate processing system 1 includes the first accommodating unit 41a corresponding to the upper group G1 and the first accommodating unit 41b corresponding to the lower group G2. The substrate processing system 1 may include a common first accommodating unit used in both of the upper group G1 and the lower group G2.

New effects or modification examples can be easily conceived by those skilled in the art. For this reason, the invention in its broader aspects is not limited to the specific details and representative example embodiment shown and described herein. Accordingly, various changes and modifications may be made without departing from the spirit or scope of the general inventive concept as defined by the appended claims and their equivalents.

We claim:

1. A substrate processing system comprising:
a first transfer apparatus configured to unload substrates from a cassette that accommodates the substrates and configured to transfer the unloaded substrates in a transfer direction;
at least one first accommodating unit configured to accommodate the substrates transferred by the first transfer apparatus;
multiple first substrate processing units, which are divided into at least two groups and arranged in a height direction, configured to perform a preset process to the respective substrates;

multiple second accommodating units, which each respectively corresponds to one of the groups and are arranged to be parallel with the at least one first accommodating unit in the height direction, configured to accommodate the substrates;

multiple second transfer apparatuses, each respectively corresponding to one of the groups, configured to unload the substrates from the second accommodating units corresponding to the same groups and transfer the substrates into the first substrate processing units belonging to the same groups;

multiple second substrate processing units, which each respectively corresponds to one of the groups and are arranged to be disposed above and below the at least one first accommodating unit and the second accommodating units in the height direction, configured to perform a predetermined process to the respective substrates; and at least one delivery apparatus configured to deliver the substrates between the at least one first accommodating unit and the second accommodating units and configured to transfer the substrates between the at least one first accommodating unit and the second substrate processing units, wherein the at least one first accommodating unit corresponding to two adjacent groups is arranged at a middle height position between the two groups, and the second accommodating units respectively corresponding to the groups are arranged above and below the at least one first accommodating unit, respectively, the at least one delivery apparatus is plural in number, and the delivery apparatuses respectively correspond to the groups, and the delivery apparatuses deliver the substrates accommodated in the at least one first accommodating unit to the second accommodating units corresponding to the same groups, respectively, wherein the delivery apparatuses deliver the substrates only perpendicular to the transfer direction.

2. The substrate processing system of claim 1, wherein the at least one delivery apparatus delivers the substrates accommodated in the at least one first accommodating unit to the second accommodating units when the preset process is performed by the first substrate processing units without performing the predetermined process by the second substrate processing units, and transfers the substrates accommodated in the at least one first accommodating unit into the second substrate processing units when the preset process is performed by the first substrate processing units after the predetermined process is performed by the second substrate processing units, and the second transfer apparatuses unload the substrates accommodated in the second accommodating units and transfer the substrates into the first substrate processing units when the preset process is performed by the first substrate processing units without performing the predetermined process by the second substrate processing units, and transfer the substrates accommodated in the second substrate processing units into the first substrate processing units when the preset process is performed by the first substrate processing units after the predetermined process is performed by the second substrate processing units.

3. The substrate processing system of claim 2, wherein the at least one first accommodating unit is plural in number, the first accommodating units respectively correspond to the groups and are stacked in multiple stages, the first transfer apparatus transfers the substrates to be processed in the first substrate processing units into the first accommodating units corresponding to the group to which the first substrate processing units belong, and the delivery apparatuses deliver the substrates accommodated in the first accommodating units corresponding to the same groups to the second accommodating units corresponding to the same groups or transfer the substrates to the second substrate processing units.

4. The substrate processing system of claim 1, wherein the at least one first accommodating unit is plural in number, the first accommodating units respectively correspond to the groups and are stacked in multiple stages, the first transfer apparatus transfers the substrates to be processed in the first substrate processing units into the first accommodating units corresponding to the group to which the first substrate processing units belong, and the delivery apparatuses deliver the substrates accommodated in the first accommodating units corresponding to the same groups to the second accommodating units corresponding to the same groups or transfer the substrates to the second substrate processing units.

* * * * *